United States Patent [19]

Inami et al.

[11] 4,339,711
[45] Jul. 13, 1982

[54] SPECTRUM DISPLAYING APPARATUS FOR MULTICHANNEL SIGNALS

[75] Inventors: Mamoru Inami, Yokohama; Yoshiaki Tanaka, Tokyo, both of Japan

[73] Assignee: Victor Company of Japan, Ltd., Yokohama, Japan

[21] Appl. No.: 167,142

[22] Filed: Jul. 9, 1980

[30] Foreign Application Priority Data

Jul. 10, 1979 [JP] Japan ................................. 54/87186
Aug. 24, 1979 [JP] Japan ........................... 54/116406[U]
Aug. 31, 1979 [JP] Japan ................................. 54/111412

[51] Int. Cl.³ ............................................. G01R 23/16
[52] U.S. Cl. .................................. 324/77 E; 324/77 B
[58] Field of Search ................ 324/77 R, 77 D, 77 E, 324/77 F, 78 D, 78 F, 77 B, 77 A, 113

[56] References Cited

U.S. PATENT DOCUMENTS

| | | | |
|---|---|---|---|
| 3,236,947 | 2/1966 | Clapper | 324/77 E |
| 3,450,989 | 6/1969 | Dickinson | 324/77 E |
| 3,482,211 | 12/1969 | Claris et al. | |
| 3,611,411 | 10/1971 | Moshier | 324/77 E |
| 3,731,188 | 5/1973 | Smith | 324/77 E |

FOREIGN PATENT DOCUMENTS 2803641 1/1978 Fed. Rep. of Germany.

Primary Examiner—Michael J. Tokar
Attorney, Agent, or Firm—Anthony H. Handal; Michael N. Meller

[57] ABSTRACT

An apparatus for displaying the spectrum of multichannel signals includes band-pass filtering circuits of a plurality of channels provided to respectively correspond to the channels of a plurality of channels. Each of the band-pass filters of respective channels comprises a group of band-pass filters having filtering bands having a respectively different center frequencies and filtering by band dividing input signals. The apparatus comprises level comparing circuits for at least rectifying respectively the outputs of band-pass filters mutually having the same filtering band of the band-pass filtering circuits of the plurality of channels, thereafter level comparing the same, and obtaining the band signal of the higher level, an indication device having indicating parts of systems of the same number as the number of the band signals thus obtained, and circuits for supplying said band signals thus obtained to the indicating device and causing the levels thereof to be displayed by the indicating parts of the respectively corresponding systems.

7 Claims, 15 Drawing Figures

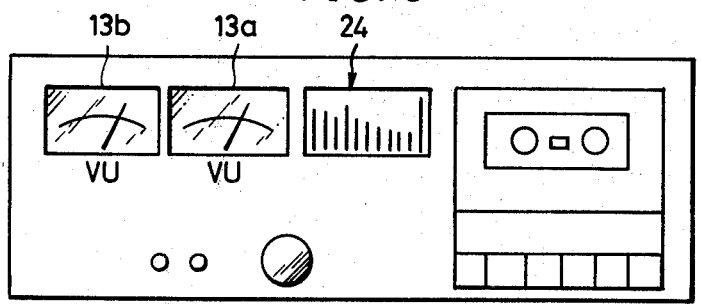
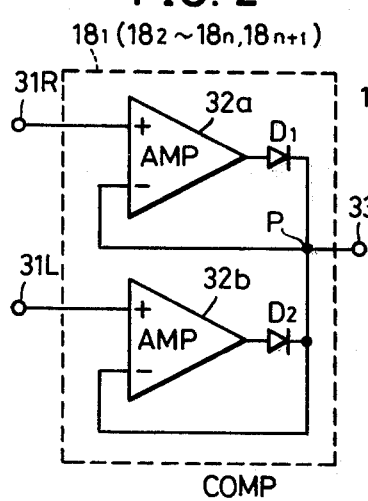
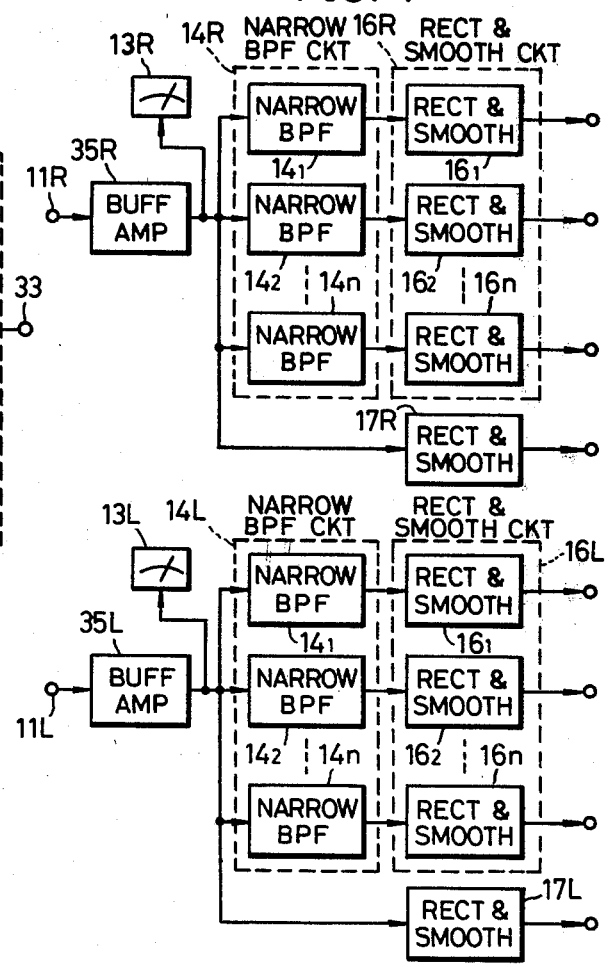

SPECTRUM DISPLAYING APPARATUS FOR MULTICHANNEL SIGNALS

BACKGROUND OF THE INVENTION

The present invention relates to apparatuses for displaying spectrums of multichannel signals, and more particularly to a spectrum display apparatus which displays the level of channel signal of higher level for every plural number of bands of respective multichannel signals.

In the prior art, a spectrum displaying apparatus having a plurality of band-pass filters for dividing an input audio signal into a plurality of frequency bands and a display device for displaying in bar-graph form the levels of the signals of each band divided by the band-pass filters has been reduced to practice. At the time of recording of an input audio signal, for example, by watching the display device, the bands in which the levels are excessively high are determined, and by operating level adjusters provided to correspond to the above mentioned bands and adapted to adjust the respective levels of the bands, all bands are so adjusted that they assume appropriate sound recording levels. As a result, good sound recording can be accomplished without distortion over all bands.

As a spectrum displaying apparatus for signals of a plurality of channels (hereinafter referred to as multichannels), the provision of a plurality of spectrum displaying apparatuses in correspondence with the multichannel signals is conceivable as a possibility. However, the provision of a plurality of spectrum displaying apparatuses in this manner entails high cost and, furthermore, requires displaying device or parts installation space of great area in a front panel of an audio signal recording and/or reproducing apparatus. Furthermore, simultaneous surveillance of a plurality of spectrum displaying device is difficult in actual practice.

Accordingly, there has been a device wherein, for example, one spectrum displaying device is provided for every two channel stereo signals, and either one of the two channel signals is selectively supplied to the spectrum displaying device by manually switching a changeover switch, the spectrum displaying of that selected signal thereby being carried out. However, this device has a disadvantage in that the state of the level at any one time of the signal of the other channel which is not being selected by the switch is completely unknown.

SUMMARY OF THE INVENTION

Accordingly, it is a general object of the present invention to provide a novel and useful spectrum displaying apparatus for multichannel signals in which apparatus the above described difficulties have been overcome.

Another and specific object of the invention is to provide a spectrum displaying apparatus which displays the level of channel signal of higher level for every plural number of bands of respective multichannel signals. In the apparatus of the invention, the level of a signal of higher level in each band is always displayed irrespective of which channel this signal belongs.

Still another object of the invention is to provide a spectrum displaying apparatus for multichannel signals in which, by switching, the sensitivity of the level displaying of the full-band signals can be caused to be lower relative to the sensitivity of level displaying of the signals of each narrow band.

Other objects and further features of the invention will be apparent from the following detailed description when read in conjunction with the accompanying drawings.

BRIEF DESCRIPTION OF THE DRAWINGS

FIG. 2 is a circuit diagram of one example of a comparison circuit in the block diagram shown in FIG. 1;

FIG. 3 is a front view of one example of a panel face of a cassette tape deck to which the spectrum displaying apparatus shown in FIG. 1 is applied;

FIG. 4 is a block diagram of the essential part of a second embodiment of the spectrum displaying apparatus of the present invention;

DETAILED DESCRIPTION

Figure 1:
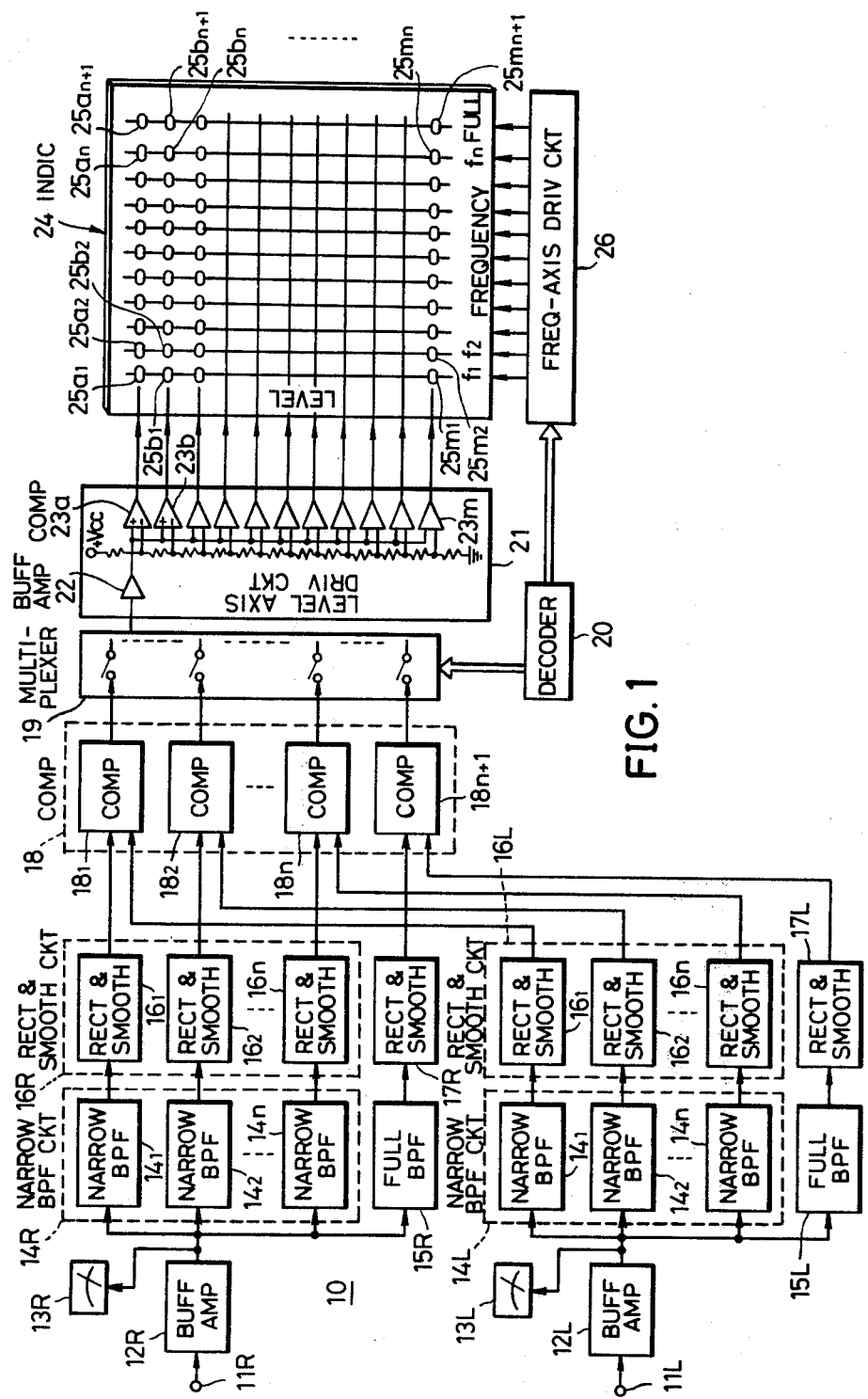
FIG. 1 is a block diagram of a first embodiment of the spectrum displaying apparatus for multichannel signals of the present invention.

The block circuit system of a first embodiment of the spectrum displaying apparatus according to the present invention will first be described in conjunction with FIG. 1. In this spectrum displaying apparatus 10, a right channel audio signal introduced thereinto through an input terminal 11R is fed, through a buffer amplifier 12R, to a VU meter 13R and to a narrow band-pass filter circuit 14R comprising n narrow band-pass filters $14_1$ through $14_n$ and to a full band-pass filter 15R. The narrow band-pass filters $14_1$ through $14_n$ respectively have narrow band-pass filtering characteristics for filtering narrow bands respectively having different center frequencies fl through fn. The full band-pass filter 15R has a full band-pass filtering characteristic for filtering the entire band of the input audio signal. The above described center frequencies are selected at, for example, 40 Hz, 150 Hz, 400 Hz, 1 KHz, 2.4 KHz, 6 KHz, and 13 KHz.

The signal components which have been filtered and band divided by the filters $14_1$ through $14_n$ and the full band signal produced as output from the filter 15R are respectively supplied to a rectification and smoothing circuit 16R comprising rectifying and smoothing circuits $16_1$ through $16_n$ and to a rectifying and smoothing circuit 17R, where they are rectified and smoothed. The resulting signal components are supplied to comparison circuit 18R comprising comparators $18_1$ through $18_n$ and $18n+1$.

A circuit of the same construction as that described above is provided also for the left channel system. Those parts in this circuit which are the same as corresponding parts in the right channel circuit are designated by the same reference numerals with the subscript L instead of the subscript R. Description of such parts will not be repeated. A left audio signal is applied to an input terminal 11L. The output signals of the rectifier-smoothers $16_1$ through $16_n$ of the rectifying and smoothing circuit 16L and of the rectifier-smoother 17L are also supplied respectively to the comparators $18_1$ through $18_n$ and $18n+1$ of the comparison circuit 18.

The comparator $18_1$ has a circuit construction, for example, as shown in FIG. 3. The comparators $18_2$ through $18_n$ and $18n+1$ also have the same circuit arrangement as the comparator $18_1$. Signals from the rectifier-smoothers $16_1$ of the rectifying and smoothing circuits 16R and 16L are supplied through terminals 31R and 31L to the noninverting input terminals of operational amplifiers 32a and 32b. The output sides of these operational amplifiers 32a and 32b are connected through diodes D1 and D2 and connected to a junction point P connected to an output terminal 33. The inverting input terminals of the operational amplifiers 32a and 32b are respectively connected to the junction point P.

Then, when the level of the right channel signal is higher than that of the left channel signal, for example, the level of the inverting input terminal of the operational amplifier 32b becomes higher than the level of the noninverting input terminal of the same amplifier. For this reason, the level of the amplifier output becomes substantially equal to that of the negative power-source voltage. As a consequence, the diode is reverse biased, and the left signal arriving at the input terminal 31L is not led out on the output side. On the other hand, only the right signal arriving at the input terminal 31R passes through the diode D1 and, with its level as it is, is led out through the output terminal 33.

Thus, the signals of all bands of the right and left channel signals separated by the respectively corresponding band-pass filters $16_1$ through $16n$, 17a, and 17b are respectively compared with respect to their levels for each band by the comparators $18_1$ through $18n$ and $18n+1$, and the signals of the bands of the channel of the higher levels are led out. Since the comparator of the above described construction comprises only operational amplifiers and diodes, the circuitry is simple.

This multiplexer 19 is supplied successively with decoded pulses of $(n+1)$ notation from a decoder 20 and successively and serially subjects the signal components from the comparators $18_1$ through $18n$, and $18n+1$ to time division. The resulting signal thus time-divided is fed to a level axis (vertical axis) driving circuit 21. In this driving circuit 21, the time-divided signal is supplied through a buffer amplifier 22 to the input terminals on one side of comparators 23a through 23m connected in parallel. Reference voltages for comparison of respectively different magnitudes resulting from the division of a positive-voltage power source $+Vcc$ by respective resistors are applied to the other input terminals of the comparators 23a through 23m. The output sides of the comparators 23a through 23m are respectively connected to level-displaying elements $25a1$ through $25an+1$, $25b1$ through $25bn+1$, . . . , $25m1$ through $25mn+1$ respectively in horizontal rows of a display device 24.

In the display device 24, the respective system of the level-displaying elements $25a1$ through $25m1$, $25a2$ through $25m2$, . . . , $25an$ through $25mn$ are respectively arranged in vertical rows or columns so as to display respectively the signal levels of frequency bands a1, a2, . . . an respectively of center frequencies f1, f2, . . . fn. The level-displaying elements $25an+1$ through $25mn+1$ are vertically arranged so as to display the signal level of the full frequency band b.

The aforementioned decoder 20 supplies the same decoded pulses as supplied to the multiplexer 19 to a frequency-axis (horizontal axis) driving circuit 26, which operates in response thereto to drive successively and time divisionally the level-displaying element groups $25a1$ through $25m1$, $25a2$ through $25m2$, . . . , $25an$ through $25mn$, $25an+1$ through $25mn+1$ and to place the same in operable state.

Accordingly, under normal conditions, the band-passed signals of channels of which levels are higher, which have been derived from the comparators $18_1$ through $18n$, and $18n+1$ are subjected to time division by the multiplexer 19 and successively supplied to the level axis driving circuit 21. Thereupon outputs corresponding to the levels of the signals higher than the comparison reference voltages are led out from the comparators. As a result, the level-displaying elements corresponding to the bands similarly time divided and driven become lit. Strictly speaking, a level-displaying element is extinguished by time division and driving. However, when the frequency of the decoder pulses has been selected at a value of the order of 100 Hz, the level-displaying element appears to be continuously lit because of the after-image or visual-persistence effect of the human eye. By the above described operation, the variations of the signal levels respectively of the bands a1 through an are displayed from time to time and moment by moment by the level-displaying element groups $25a1$ through $25m1$, . . . $25an$ through $25mn$. Similarly, the variation of the level of the full band-passed signal is displayed by the level-displaying element group $25an+1$ through $25mn+1$.

Then, as described hereinbefore, of the signals of the bands respectively of the right and left channels, the signals of the higher level are sent out as outputs in the comparators $18_1$ through $18n$, and $18n+1$. For this reason, in the display device 24, of the right and left channels in each band, the levels of the signal components of higher level are displayed and indicated. Therefore, by watching one display device 24, the frequency bands in which the levels become excessive can be readily detected with respect to a plurality of channels. In this connection, while it is not possible to determine, with respect to each band, that channel of the right and left channels whose signal is of higher level, there is substantially no problem since level adjustment is carried out in equal proportion with respect to both channels during actual level adjustment in most instances.

Further, when the group of elements 25an+1 through 25mn+1 displaying the full-band level is used as a peak level meter, the peak level immediately before the overload level (for example, +5 dB) is reached can be detected by observation, and by the use together of the VU meters 13R and 13L, the sound recording level can be correctly recognized and adjusted by means of a graphic equalizer.

By using fluorescent display tubes as displaying elements of the various levels, level display can be carried out correctly and positively with good response relative to the input signal and without the occurrence of display error such as that due to delay for displaying.

One example of a panel surface of a two-channel stereo cassette tape deck provided with the above described spectrum displaying device is shown in FIG. 3. In FIG. 3, those parts which are the same as corresponding parts in FIG. 1 are designated by like reference numerals. Description of such parts will not be repeated.

The essential parts of the second embodiment of the apparatus of the present invention are shown in FIG. 4. In FIG. 4, those parts which are the same as corresponding parts in FIG. 1 are designated by like reference numerals. Description of such parts will not be repeated. In this second embodiment of the invention, buffer amplifiers 35R and 35L used in place of the buffer amplifiers 12R and 12L in FIG. 1 have the same filtration bands as the full-band filters 15R and 15L in FIG. 1. For this reason, in the present embodiment of the invention, the band-pass filters 15R and 15L are not employed.

The output signals of the buffer amplifiers 35R and 35L are respectively supplied to the narrow band-pass filters $14_1$ through $14n$ respectively of narrow band-pass filter circuit 14R and 14L and, at the same time, directly, to rectifier-smoothers 17R and 17L. The outputs of rectifier-smoothers $16_1$ through $16n$, 17R, and 17L are supplied to a comparison circuit similarly as in the preceeding first embodiment of the invention. Illustration and description of the circuit construction following the comparison circuit and of the operation thereof will be omitted.

Figure 5:
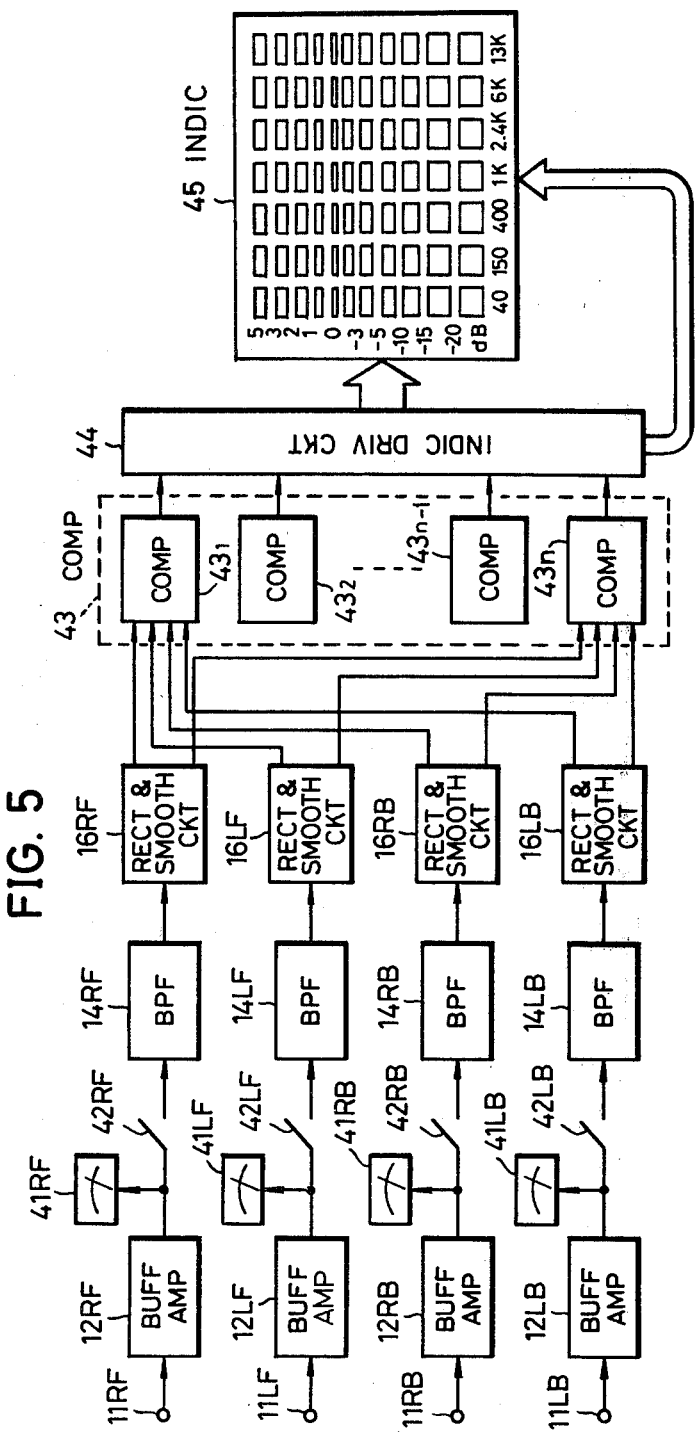
FIG. 5 is a block diagram of a third embodiment of the spectrum displaying apparatus of the present invention.

Next, the third embodiment of the apparatus of the invention will be described in conjunction with the block diagram of FIG. 5. The right-front, left-front, right-back, and left-back channel audio signals applied to input terminals 11RF, 11LF, 11RB, and 11LB are respectively fed into buffer amplifiers 12RF, 12LF, 12RB, and 12LB. The resulting outputs of these buffer amplifiers are respectively supplied to peak program meters (PPM) 41RF, 41LF, 41RB, and 41LB and, at the same time, are respectively supplied by way of switches 42RF, 42LF, 42RB, and 42LB successively to band-pass filtering circuits 14RF, 14LF, 14RB, and 14LB comprising a plurality of narrow-band filters and rectifying and smoothing circuits 16RF, 16LF, 16RB, and 16LB, and 16LB comprising a plurality of rectifier-smoothers. The resulting outputs of these rectifying and smoothing circuits are respectively supplied to comparators $43_1$ through $43n$ of a comparison circuit 43.

Figure 6:
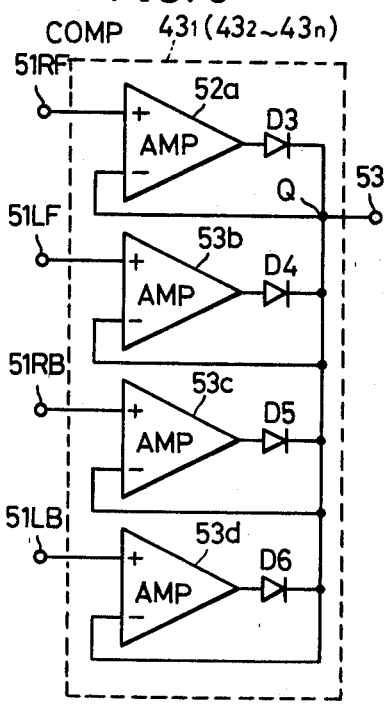
FIG. 6 is a circuit diagram of one embodiment of a comparison circuit in the block diagram shown in FIG. 5.

The comparator $43_1$ (identical to each of $43_2$ through $43n$) has a circuit construction, for example, as illustrated in FIG. 6. Signals from the above mentioned rectifier-smoothers are introduced into this circuit through terminals 51RF, 51LF, 51RB, and 51LB and applied to the noninverting input terminals of operational amplifiers 52a through 52d. The output sides of these operational amplifiers are connected through diodes D3 through D6 to a junction point Q connected to an output terminal 53. The inverting input terminals of the operational amplifiers 52a through 52d are commonly connected to the junction point Q. As is readily understandable from the description given hereinbefore of the comparator shown in FIG. 2, of the signals of the four channels applied to the input terminals 51RF, 51LF, 51RB, and 51LB, the signal of the channel of the highest level is led out through the output terminal 53.

The output signals of the comparison circuit 43 are supplied to an indication drive circuit 44 of a construction including components such as the multiplexer 19, the decoder 20, the level axis drive circuit 21, and the frequency axis drive circuit 26 shown in FIG. 1, and levels are indicated on a spectrum displaying part 45. In the present embodiment of the invention, full-band level indication elements are not provided in the spectrum display part 45.

Figure 7:
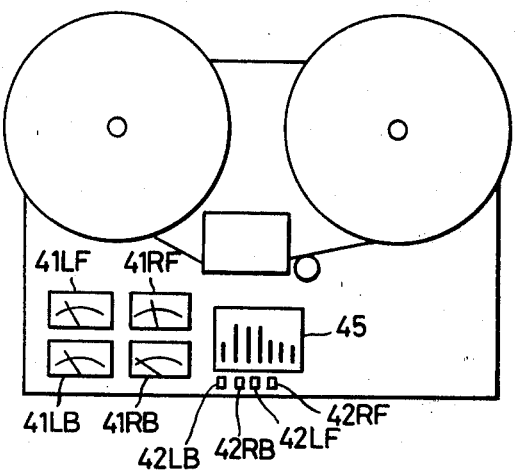
FIG. 7 is a front view of one example of a panel face of a cassette tape deck to which the apparatus shown in FIG. 5 is applied.

One example of a 4-channel tape deck provided with the above described spectrum display device is shown in FIG. 7. In FIG. 7, those parts which are the same as corresponding parts in FIG. 5 are designated by like reference numerals. Description of such parts will be omitted.

In the case when it is desired to know the maximum level for each band with respect to the four channels, all of the four switches 42RF, 42LF, 42RB, and 42LB are closed. In the case where level indications of, for example, the right-front and left-front channels are necessary, the switches 42RF and 42LF are closed, and the switches 42RB and 42LB are opened. In the case, for example, level indications of the right-back and the left-back channels are necessary, the switches 42RB and 42LB are closed, and the switches 42RF and 42LF are opened.

In this application of the spectrum displaying apparatus of the invention, indicating elements corresponding to the peak program meters 41RF, 41LF, 41RB, and 41LB may be provided in the spectrum displaying device 45.

The pick noise level of the passed output of the band-pass filters $14_1$ through $14n$, for the same input pink noise, is lower than that of the full-band filters 15R and 15L by a level difference ΔL expressed by the following equation in terms of the intergrated value P of the pass-band energy of the narrow-band filters and the intergrated value Pt of the pass-band energy of the full-band filters, in the case where the sensitivities of both filters are the same.

$$\Delta L = 10 \text{ Log} \frac{Pt}{P} \text{ (dB)}$$

The above mentioned energy intergrated value P is the same in each of the divided frequency bands unrelatedly to the center frequency of the divided frequency band. Here, it is assumed that the Q, which is equal to (center frequency of passed frequency band)/(width of passed frequency band), of the narrow-band filter is constant. The level difference ΔL is, for example, of the order of 6 to 8 dB.

However, since the sensitivities of the narrow-band filters and the full-band filters have been considered to be the same in each of the above described embodiments of the invention, the integrated value of the energy in the entire pass band of the full-band filters becomes greater than the integrated energy value in the pass bands of the narrow-band filters, the level difference ΔL expressed by the above equation arises. For this reason, when the indicated level of a band signal which has passed through a narrow-band filter is set at a relatively high value within the indicated dynamic range, the indicated level of a full-band signal which has passed through a full-band filter exceeds the indicated dynamic range. Then, if the level indication of the full-band signal is so set that it will not exceed the scale, a problem arises in that the dynamic range of the level indication of the band signal which has passed through the narrow-band filter cannot be effectively utilized.

Figure 8:
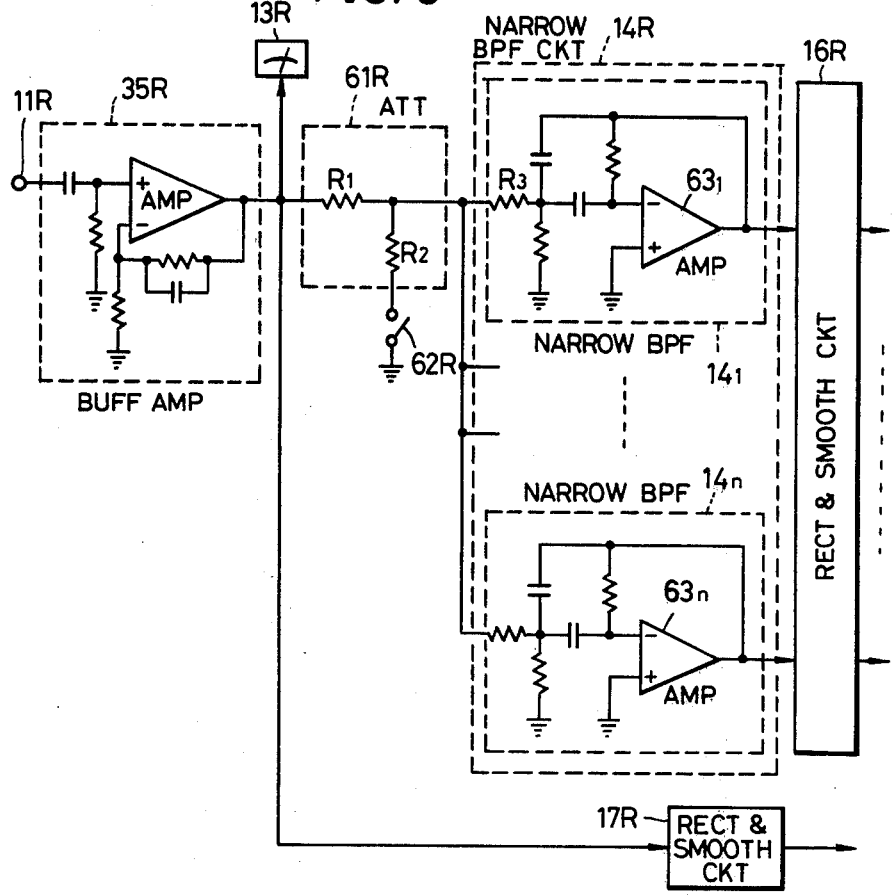
FIG. 8 is a circuit diagram of the essential part of a fourth embodiment of the spectrum displaying apparatus of the present invention.

This problem has been solved in a fourth embodiment of the invention, which will now be described in conjunction with FIG. 8 showing the circuit system of one portion of this fourth embodiment of the spectrum displaying apparatus according to the invention. In FIG. 8, those parts which are the same as corresponding parts in FIGS. 1 and 4 are designated by like reference numerals. While only the former-stage part of the right channel system is shown in FIG. 8, the latter-stage part not shown therein is the same as that in the above described preceding embodiment of the invention. Furthermore, the systems of the other channels such as the left channels have the same organization as that illustrated in FIG. 8.

The output signal of a buffer amplifier 35R is fed directly to a rectifying and smoothing circuit 17R and, at the same time, is supplied by way of an attenuator 61R to a band-pass filter circuit 14R. The attenuator 61R comprises resistors R1 and R2. An ON-OFF switch 62R is connected between the resistor R2 and ground (earth).

Then, when the levels are to be indicated with the sensitivity of the level indication (spectrum display) of each band made higher than the sensitivity of the level indication of the full band, the switch 62R is opened. Here, the amplification $(R1+R2)/R2$ of the filters $14_1$ through $14n$ is set at a value greater than the amplification of the buffer amplifier 35R, and the absolute value of the amplification of the filters $14_1$ through $14n$ is set equal to the absolute value of the attenuation of the attenuator 61R.

Figure 9:
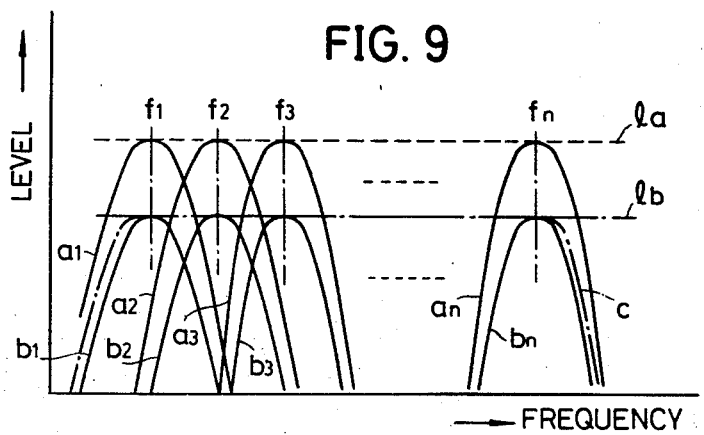
FIG. 9 is a characteristic curve of level versus frequencies of the signals in the circuit of FIG. 8.

When the switch 62R is in its opened state, the attenuator 61R does not operate as an attenuator. For this reason, the output signal of the buffer amplifier 35R is supplied to the filters $14_1$ through $14n$ without being attenuated by the attenuator 61R and is amplified in amplifiers $63_1$ through $63n$. Consequently, the characteristics of the output signals of the filters $14_1$ through $14n$ are as indicated by curves a1 through an in FIG. 9. On the other hand, the characteristic of the output signal of the buffer amplifier 35R serving doubly as a full-band filter is as indicated by curve c. As is apparent from a comparison of the characteristic curves a1 through an and curve c, the level of the output signal of each narrow-band filter is substantially increased over the level of the output signal of the buffer amplifier 35R. Here, the difference between the maximum level la of the curves a1 through an and the maximum level lb of the curve c is so set that it will be of the order of 6 to 8 dB. Accordingly, the levels of all band signals can be indicated with effective utilization of a specific dynamic range and without lack of level.

On the other hand, in the case where an input signal comprising only a specific spectral component arrives, the levels of the narrow-band signal and the full-band signal are substantially equal. In this case, if a narrow-band signal which has been filtered by and led out of the narrow band-pass filter is then amplified, the level of the narrow-band signal will become higher than the level of the full-band signal. Accordingly, in this case, the switch 62R is closed. As a result, the output signal of the buffer amplifier 35R is attenuated with an attenuation of $R1/(R1+R2)$ in the attenuator 61R and thereafter is supplied to the band-pass filters $63_1$ through $63n$. Then, since the absolute value of the attenuation of the attenuator 61R and the absolute value of the amplification of the band-pass filters are set to be equal, the levels of the narrow-band signal and the full-band signal are indicated with the same sensitivity. Therefore, level indication can be carried out in an excellent manner without occurrences such as exceeding of scales and insufficiencies of level.

In this connection, it is to be noted that the resistance value of the resistor R1 of the attenuator 61R is set amply lower than the resistance value of the resistor R3 provided on the input side of the band-pass filter $14_1$ ($14_2$ through $14n$), and, for this reason, even if the switch 62R is closed and the attenuator 61R is caused to function in the circuit, no adverse effect will occur in the frequency characteristics of the band-pass filters $14_1$ through $14n$.

In the case where the buffer amplifier 35R does not have a full-band filtering characteristic, a full-band filter may be provided in the initial stage of the rectifier-smoother 17R as in the first embodiment of the invention illustrated in FIG. 1.

As a modification of the present embodiment of the invention, a circuit organization wherein, instead of providing the attenuator 61R in the initial stage of the narrow band-pass filter, it is provided in the transmission system of the full-band signal (for example, in the prior stage of the rectifier-smoother 17R) may be used. In this case, the ON-OFF mode of the switch 62R becomes opposite to that described above.

Figure 10:
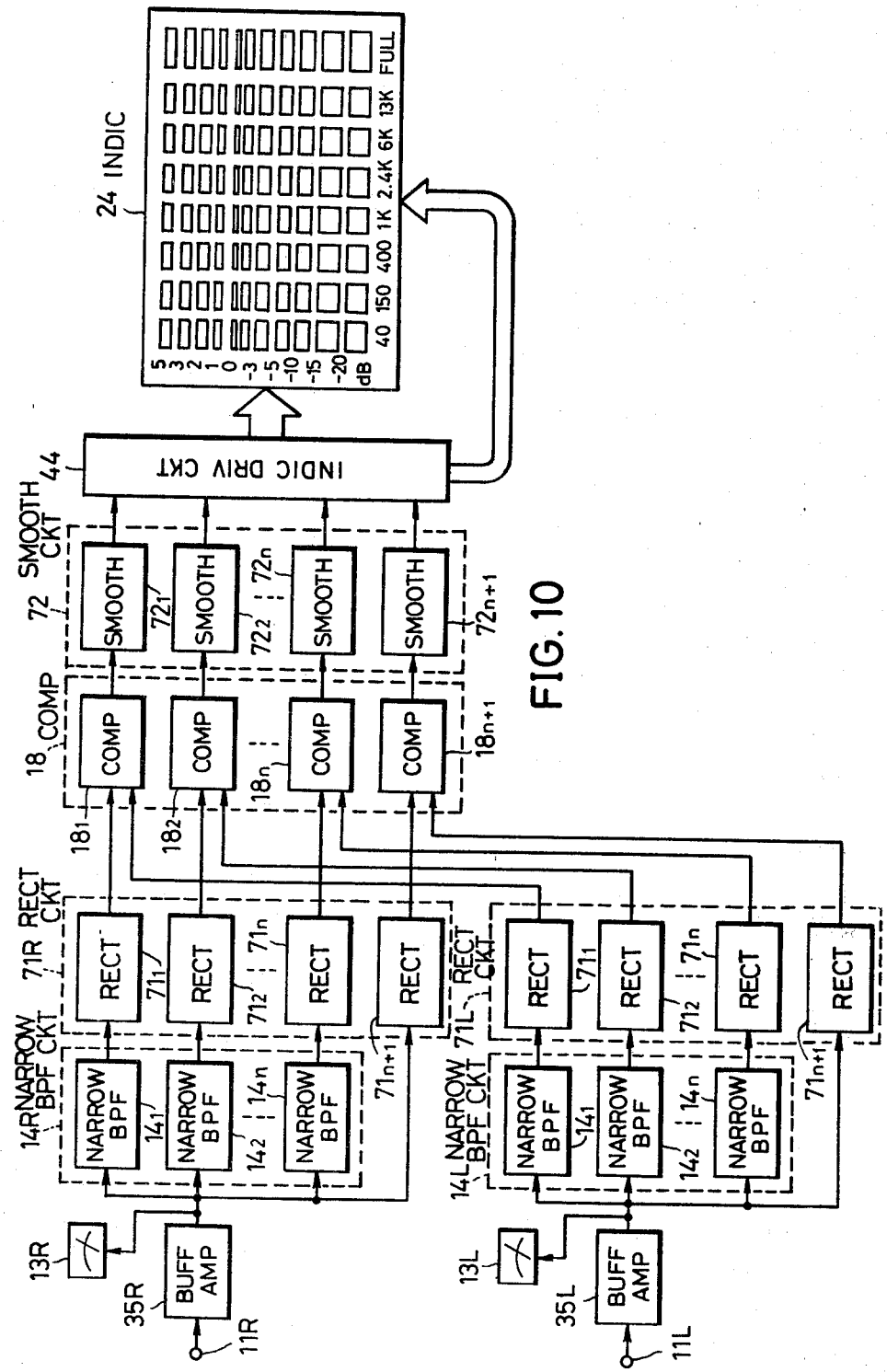
FIG. 10 is a block diagram of a fifth embodiment of the spectrum displaying apparatus of the present invention.

In each of the above described embodiments of the invention, a rectifier-smoother is provided for each band of each channel, but this entails the problem of complication of the circuit organization. An embodiment of the invention in which this problem is solved will now be described in conjunction with FIG. 10. In FIG. 10, those parts which are the same as corresponding parts in FIGS. 1 and 4 are designated by like reference numerals. Description of such parts will be omitted.

The output signals of the band-pass filters $14_1$ through $14n$ of narrow band-pass filter circuits 14R and 14L and the output signals of buffer amplifiers 35R and 35L are respectively supplied to full-wave rectifiers $71_1$ through $71n$ and $71n+1$ of full-wave rectification circuits 71R and 71L and are subjected to full-wave rectification. The output signals of positive polarity of the full-wave rectification circuits 71R and 71L are supplied to the comparators $18_1$ through $18n$ and $18n+1$ of a comparison circuit 18 and are subjected to level comparison similarly as in the aforedescribed first embodiment of the invention.

Figure 11:
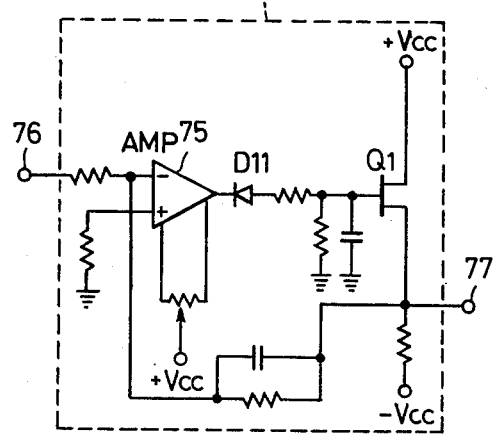
FIG. 11 is a circuit diagram of one embodiment of a smoothing circuit in the block diagram shown in FIG. 10.

The resulting output signal of the comparators $18_1$ through $18n$ and $18n+1$ are respectively supplied to smoothing circuits $72_1$ through $72n$ and $72n+1$ of a smoothing circuit group 72. One example of the circuit organization of the smoothing circuit $72_1$ (identical to smoothing circuits $72_2$ through $72n+1$) is shown in FIG. 11. This smoothing circuit $72_1$ comprises resistors, capacitors, a diode D11, an operational amplifier 75, and and FET Q1, connected as shown, and is capable of carrying out peak-value integration of high-speed response. A signal from the comparator $18_1$ is applied to an input terminal 76 and is smoothed in this smoothing circuit 72 and is then sent through an output terminal 77 to a multiplexer within an indication drive circuit 44.

Figure 12:
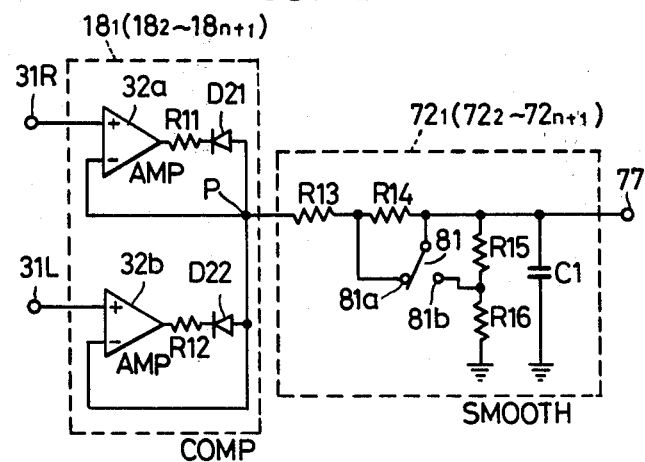
FIG. 12 is a circuit diagram of a comparator and another embodiment of the smoothing circuit shown in FIG. 10.

In the case where the full-wave rectification circuits 71R and 71L are adapted to produce respectively full-wave rectified outputs of negative polarity, the comparator $18_1$ ($18_2$ through $18n+1$) and the smoothing circuit $72_1$ ($72a$ through $72n+1$) have respective circuit compositions, for example, as shown in FIG. 12. A feature in which the comparator $18_1$ shown in FIG. 12 differs from the comparator $18_1$ illustrated in FIG. 2 is that, on the output sides of the operational amplifiers 32a and 32b, respectively, series-connected combinations of a resistor R11 and a diode D21 of reverse polarity and of a resistor R12 and a diode D22 of reverse polarity are connected. The smoothing circuit $72_1$ comprises resistors R13 through R16, a capacitor C1, and a switch 81 all connected as shown. The fixed contact points 81a and 81b of this switch 81 are respectively connected to a junction point between the resistors R13 and R14 and to a junction point between the resistors R15 and R16. The movable contact of this switch 81 is connected to a junction point between the resistors R14 and R15. The smoothing circuit $72_1$ can carry out peak-value integration in the manner of a peak meter when the movable contact of the switch 81 is connected to the contact point 81a and can carry out average-value integration in the manner of VU meter when the movable contact is connected to the contact point 81b.

Figure 13:
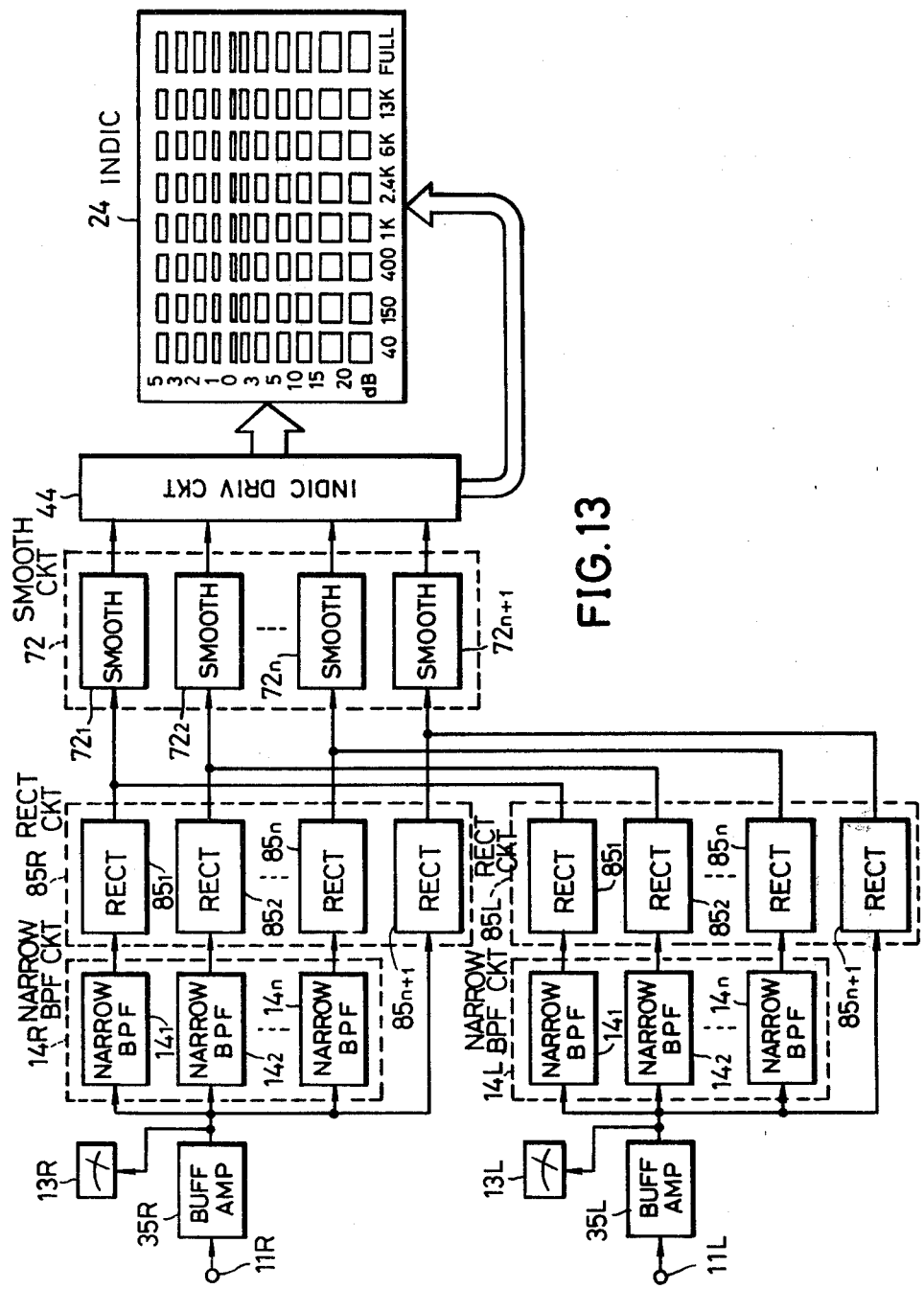
FIG. 13 is a block diagram of a sixth embodiment of the spectrum displaying apparatus of the present invention.

Still another embodiment of the device of the present invention will now be described with reference to FIG. 13. In FIG. 13, those parts which are the same as corresponding parts in FIG. 10 are designated by like reference numerals. Description of such parts will be omitted. Rectifiers $85_1$ through $85n$ and $85n+1$ of rectifying circuits 85R and 85L respectively comprise diodes. The output sides of the rectifiers $85_1$, $85_1$, $85_2$, $85_2$, ... corresponding respectively to each of the bands of the rectifying circuits 85R and 85L are connected to each other and connected to the input sides of smoothing circuits $72_1$ through $72n+1$. For example, of the signals half-wave rectified by the rectifiers $85_1$ and $85_1$ respectively comprising diodes, that signals of the higher level is supplied to the smoothing circuit $72_1$. For this reason, in the present embodiment of the invention, comparison circuits are not provided, and the circuit construction is simple.

Figure 14:
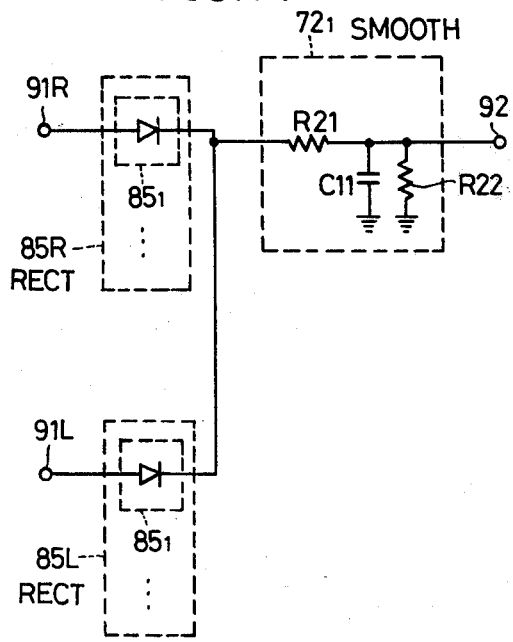
FIG. 14 is a circuit diagram of one example of a recitifying and smoothing circuit in the block diagram shown in FIG. 13.

One specific example of a portion of the rectifying circuits 85R and 85L and the smoothing circuit 72 in the block system shown in FIG. 13 is shown in FIG. 14. The rectifiers $85_1$, $85_1$ respectively of the rectifying circuits 85R and 85L respectively comprise diodes whose output sides are connected together and further connected to the smoothing circuit $72_1$ comprising resistors R21 and R22 and a capacitor C11 all connected as shown. Signals from band-pass filters $14_1, 14_1$ of band-pass filtering circuits 14R and 14L are respectively applied to terminals 91R and 91L and rectified in respective rectifiers $85_1, 85_1$, and the rectified signal of the higher level is supplied to the smoothing circuit $72_1$. The resulting smoothed signal led out through an output terminal 92 is supplied to the multiplexer of the indication drive circuit 44.

Figure 15:
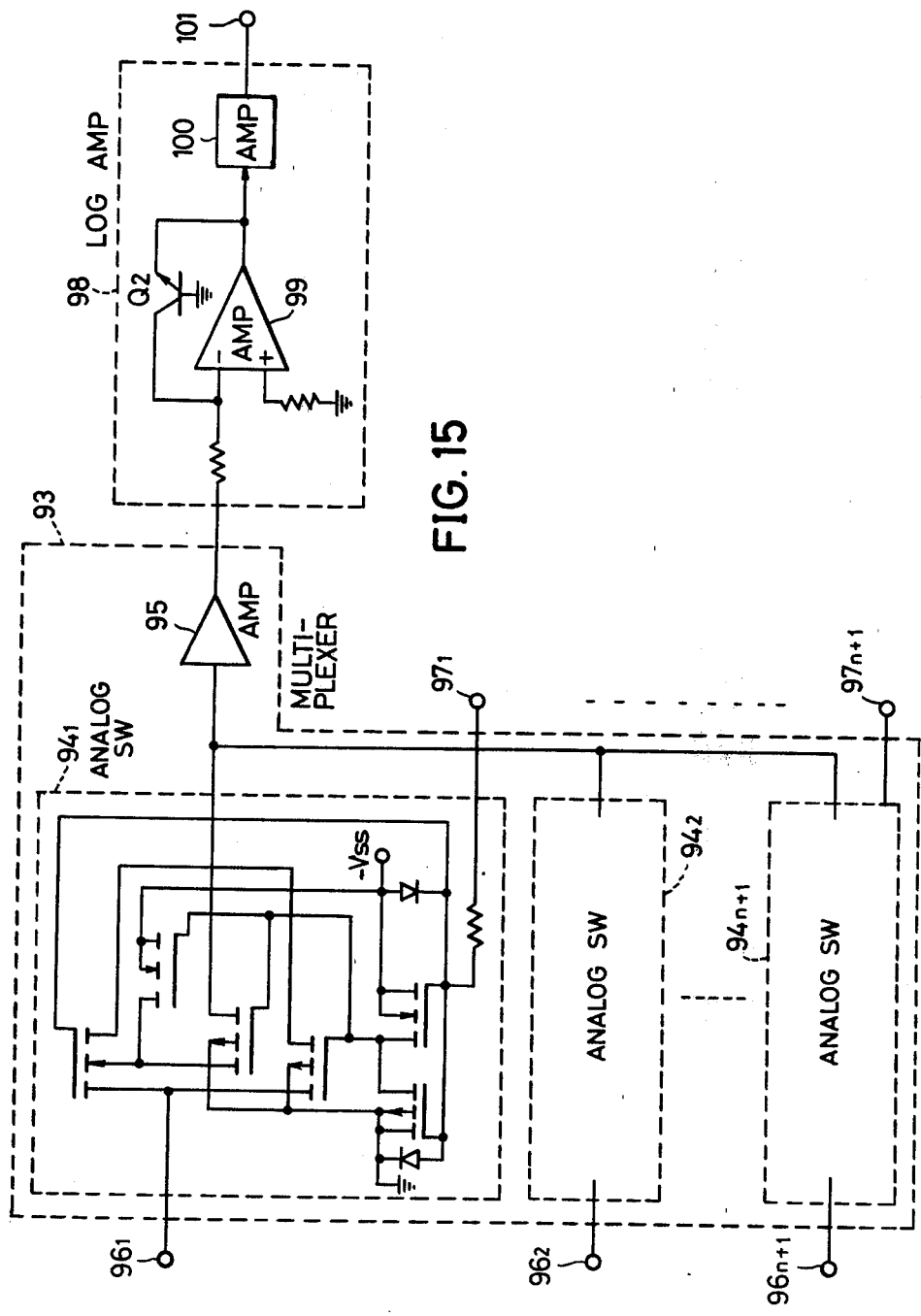
FIG. 15 is a circuit diagram of one embodiment of specific circuit of one part of the display device circuit in the block diagram shown in FIG. 13.

One embodiment of a specific circuit according to the invention of one portion of the indication drive circuit 44 is shown in FIG. 15. In this circuit, the multiplexer 93 comprises analog switch circuits $93_1$ through $93n+1$ of C-MOS intergrated circuits and a buffer amplifier 95 of an inverted type. The signals supplied to the analog switch circuits $93_1$ through $93n+1$ are there successively and serially time divided by n-notation decoded signals respectively applied through terminals $97_1$ through $97n+1$ and a led out as n serial signals, which are supplied to a logarithmic amplifier 98.

This logarithmic amplifier 98 comprises an operational amplifier 99, a transistor Q2 connected between the output side and the inverting input terminal of the operational amplifier 99, and an amplifier 100. The logarithmic amplifier 98 is adapted to produce an output voltage Vout equal to K.log Vin when an input voltage Vin is applied thereto. The n serial signals supplied from the multiplexer 93 to the logarithmic amplifier 98 is there logarithmically compressed and then supplied to a level axis drive circuit of a later stage. Thus, by the use of the logarithmic amplifier 98, a level is logarithmically compressed and indicated, whereby the dynamic range indicated for each band can be made wide.

Further, this invention is not limited to these embodiments but various variations and modifications may be made without departing from the scope of the invention.

What we claim is:

1. An apparatus for displaying the spectrum of multichannel signals comprising:
    band-pass filtering circuits of a plurality of channels provided to respectively correspond to the channels of a plurality of channels, each of said band-pass filters of respective channels comprising a group of band-pass filters having filtering bands having respectively different center frequencies and filtering by band dividing input signals;
    level comparing means for at least rectifying respectively the outputs of band-pass filters mutually having the same filtering band of the band-pass filtering circuits of said plurality of channels, thereafter level comparing the same, and obtaining the band signal of the higher level;
    an indication device having indicating parts of systems of the same number as the number of said band signals thus obtained; and
    means for supplying said band signals thus obtained to said indicating device and causing the levels thereof to be displayed by the indicating parts of the respectively corresponding systems.

2. An apparatus for displaying the spectrum of multichannel signals as claimed in claim 1 in which said level comparing means comprises rectifying and smoothing circuits of a plurality of channels each of which rectifying and smoothing circuits comprises groups of rectifier-smoothers which are provided to respectively correspond to said band-pass filters and respectively rectify and smooth the outputs of said band-pass filters, and comparison circuits comprising a group of comparators for comparing the levels of the outputs of the rectifier-smoothers corresponding to band-pass filters mutually having the same filtering band of the band-pass filtering circuits of said plurality of channels and obtaining the output of the higher level.

3. An apparatus for displaying the spectrum of multichannel signals as claimed in claim 1 in which said level comparing means comprises rectifying circuits of a plurality of channels each of which rectifying circuits comprises groups of rectifiers which are provided to respectively correspond to said band-pass filters and respectively rectify the outputs of said band-pass filters, comparison circuits comprising a group of comparators for comprising the levels of the outputs of the rectifiers corresponding to band-pass filters mutually having the same filtering band of the band-pass filtering circuits of said plurality of channels and obtaining the output of the higher level, and smoothing circuits comprising smoothers which are provided to respectively correspond to said comparators and respectively smooth the outputs of said comparators.

4. An apparatus for displaying the spectrum of multi-channel signals as claimed in claim 1 in which the level comparing means comprises rectifying and comparing circuits which comprise groups of diodes provided to respectively correspond to said band-pass filters and rectifying respectively the outputs of said band-pass filters, which are connected to the output sides of diodes corresponding to band-pass filters mutually having the same filtering band of the band-pass filtering circuits of said plurality of channels, and which obtain the output of the higher level and smoothing circuits comprising groups of smoothers provided to respectively correspond to junction points on the output sides of said diodes and respectively smoothing the outputs thereof.

5. An apparatus for displaying the spectrum of multi-channel signals as claimed in claim 2 in which each of the comparators of said comparison circuits comprises operational amplifiers of which noninverting input terminals are respectively supplied with the outputs of the band-pass filters of the channels and diodes connected at one side thereof respectively to the output sides of said operational amplifiers and commonly connected at the other side thereof to an output terminal, the common junction point of the diodes on said other side thereof being connected to the inverting input terminals of the operational amplifiers.

6. An apparatus for displaying the spectrum of multi-channel signals as claimed in claim 3 in which each of the comparators of said comparison circuits comprises operational amplifiers of which noninverting input terminals are respectively supplied with outputs of the band-pass filters of the channels and diodes connected at one side thereof respectively to the output sides of said operational amplifiers and commonly connected at the other side thereof to an output terminal, the common junction point of the diodes on said other side thereof being connected to the inverting input terminals of the operational amplifiers.

7. An apparatus for displaying the spectrum of multi-channel signals as claimed in claim 1 which further comprises buffer amplifiers provided in a stage prior to said band-pass filtering circuits in respective correspondence to channels of said plurality of channels and having band-pass filtering characteristics enveloping the full band of said band-pass filtering circuits, attenuation circuits, each provided between a buffer amplifier and the corresponding band-pass filtering circuit of each channel, and a switch for placing each of said attenuation circuits selectively in operative state or in inoperative state, said band-pass filters having organizations including amplifiers.

* * * * *